United States Patent [19]
Matsushita et al.

[11] Patent Number: 5,729,020
[45] Date of Patent: Mar. 17, 1998

[54] HYBRID TYPE INFRARED DETECTOR

[75] Inventors: Keiichi Matsushita, Yokohama; Keitaro Shigenaka, Tokyo; Katsuyoshi Fukuda, Yokosuka, all of Japan

[73] Assignee: Kabushiki Kaisha Toshiba, Kawasaki, Japan

[21] Appl. No.: 697,447

[22] Filed: Aug. 23, 1996

[30]     Foreign Application Priority Data

Aug. 25, 1995 [JP] Japan ................................ 7-217085

[51] Int. Cl.$^6$ .................................................. H01L 33/00
[52] U.S. Cl. ........................... 250/370.08; 257/431
[58] Field of Search ................. 250/370.08, 370.12, 250/370.13, 370.14; 257/431, 442; 437/226

[56]           References Cited
        FOREIGN PATENT DOCUMENTS

| | | |
|---|---|---|
| 4-199877 | 7/1992 | Japan . |
| 08130297 | 5/1996 | Japan .................. 250/370.08 |

OTHER PUBLICATIONS

"HgCdTe On Si For Hybrid and Monolithic FPAs," by Ken Zanio. SPIE vol. 1308 Infrared Detectors and Focal Plane Arrays (1990); pp. 180–193.

*Primary Examiner*—Michael J. Tokar
*Assistant Examiner*—Richard Hanig
*Attorney, Agent, or Firm*—Oblon, Spivak, McClelland, Maier & Neustadt, P.C.

[57]                ABSTRACT

The hybrid type infrared detector includes a plurality of photodiodes constructed by p-n junctions made of compound semiconductor material on a silicon substrate, a signal processing portion formed on another substrate, and a connecting member for electrically connecting the plurality of photodiodes with the signal processing portion, and for injecting carriers generated by the photodiodes into the signal processing portion, and is characterized in that partitioning portions are formed along the cleavage plane of the compound semiconductor material.

9 Claims, 2 Drawing Sheets 5,729,020

HYBRID TYPE INFRARED DETECTOR

BACKGROUND OF THE INVENTION

1. Field of the Invention

The present invention relates to an infrared detector, and particularly, to a hybrid type infrared detector which uses compound semiconductor material to detect and optoelectro-transduce infrared light.

2. Description of the Related Art

Conventionally, as material for an infrared detector, it is known to use HgCdTe which is a compound semiconductor consisting of group II elements and group VI elements on the periodic table (which will be omitted as a group II–VI compound semiconductor, hereinafter). HgCdTe is a mixed crystal of CdTe and HgTe. In case of using HgCdTe for an infrared detector, it is possible to change the sensitivity wavelength of the infrared detector, by changing the composition.

A conventional infrared detector is manufactured in a manner in which a p-type HgCdTe layer as an infrared detection layer is formed, for example, on a silicon substrate (n11) face, an n-type HgCdTe portion is formed by ion-implantation at that region of the p-type HgCdTe layer which corresponds to a pixel, and an n-type HgCdTe portion and a signal processing portion formed on another silicon substrate are electrically connected by an In electrode. Normally, the distance between pixels is about 40 μm. In addition, the electric connection between the n-type HgCdTe portion and the signal processing portion is attained, for example, by forming an In bump at a signal processing portion and by pressing the In bump into contact with the In electrode.

In an infrared detector having the structure as described above, since a photodiode is formed at a p-n junction between a p-type HgCdTe layer and an n-type HgCdTe portion, photo-carriers are generated if infrared light enters into the p-n junction of the photodiode. Those carriers are diffused and injected into a signal processing portion through an In bump. Then, the carriers are outputted in form of an image.

Normally, an infrared detector is cooled when it is operated and used. In this case, there is a large difference between the thermal expansion coefficients of silicon and HgCdTe, and therefore, a thermal stress is generated at a light detecting portion when cooled. This thermal stress makes the substrate of the infrared detector deformed. Therefore, the In bump breaks or is peeled from the In electrode, thereby causing a defective pixel. Consequently, a conventional infrared detector attains a considerably low reliability.

SUMMARY OF THE INVENTION

The present invention has been made in view of the above situation, and has an object of providing a hybrid type infrared detector which has high reliability and high sensitivity even when the detector is cooled for use.

This object is achieved by a hybrid type infrared detector comprising a plurality of photodiodes comprised of p-n junctions made of compound semiconductor material on a silicon substrate, a signal processing portion formed on another substrate, and a connecting member for electrically connecting the plurality of photodiodes with the signal processing portion and for injecting carriers generated by the photodiodes into the signal processing portion, wherein partitioning portions are formed along a cleavage plane of the compound semiconductor material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

In the following, the hybrid type infrared detector according to the present invention will be specifically explained with reference to the drawings.

Figure 1:
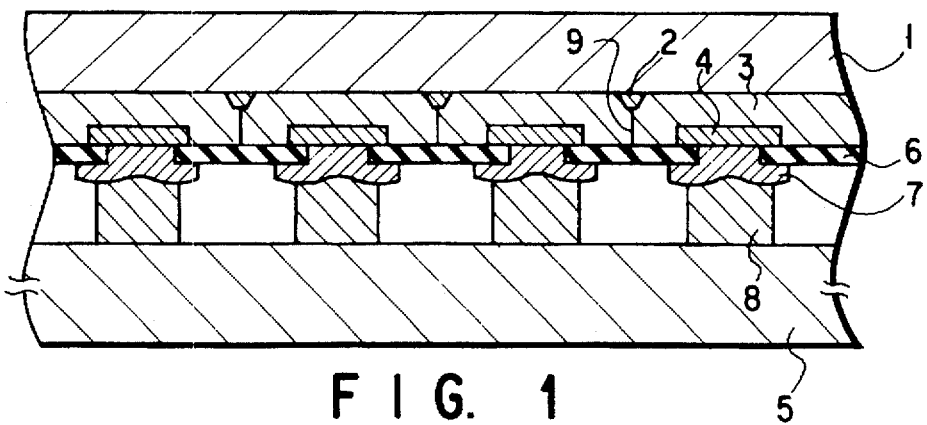
FIG. 1 is a cross-sectional view showing an example of a hybrid type infrared detector according to the present invention.

FIG. 1 is a cross-sectional view showing an example of a hybrid type infrared detector according to the present invention. In this figure, the reference numeral 1 denotes a silicon substrate. On the silicon substrate 1, a p-type layer 3 made of compound semiconductor material is formed. The p-type layer 3 is formed by means of epitaxial growth under a high temperature, such as an LPE (Liquid Phase Epitaxy) method, an MBE (Molecular-Beam Epitaxy) method, an MOCVD (Metalorganic Chemical Vapor Deposition) method, or the like. The thickness of the p-type layer 3 should preferably be 5 μm to 20 μm in consideration of the absorption of the infrared light or the diffusion length of the carrier.

An n-type portion 4 of the compound semiconductor material is formed at the region of the p-type layer 3 corresponding to a pixel. The n-type portion 4 is formed by a method such as ion-implantation, epitaxial growth, or the like. By a p-n junction between the p-type layer 3 and the n-type portion 4, a photodiode is constructed. In FIG. 1, an n-type portion 4 is formed in the p-type layer 3, but these conductive types may be reversed, i.e., a photodiode may be constructed by forming a p-type portion in an n-type layer. As the compound semiconductor material, it is possible to use compound semiconductor material consisting of group II elements and group VI elements on the periodic table, and compound semiconductor material consisting of group IV elements and group VI elements. Specifically, HgCdTe and PbSnTe may be used.

In addition, a projecting portion 2 is formed along a cleavage plane of the compound semiconductor material forming the p-type layer 3 on the other region of the silicon substrate 1 than the pixel region, and a partitioning portion 9 is formed in the p-type layer 3, with the projecting portion 2 used as a starting point. Note that the cleavage plane of the compound semiconductor material can be adjusted by defining the face orientation of the silicon substrate 1 for example [n11]. For example, the cleavage plane of HgCdTe becomes (011) face, i.e., the face orientation becomes [011], by depositing compound semiconductor material such as HgCdTe, with the face orientation of the silicon substrate 1 being defined to [211], i.e., by depositing compound semiconductor material such as HgCdTe onto the (211) face of the silicon substrate 1. Therefore, by selecting the face orientation of the silicon substrate 1 and the compound semiconductor material, the cleavage plane of the compound semiconductor material can be adjusted, and the position of the partitioning portion 9 can be changed.

In addition, a clack or the like formed in the thickness direction of the p-type layer 3 from the projecting portion 2 as a starting point may be regarded as the partitioning portion 9. Specifically, after a projecting portion 2 and the p-type layer 3 are formed, the resulting structure is subject to the cooling. Thereby, a stress caused by a thermal strain concentrate at the projecting portion 2 to create a clack. Note that it is possible to form a partitioning portion 9 by providing a denature region having a changed composition on the region other than the pixel of the p-type layer 3, without forming a projecting portion 2.

On the p-type layer 3, a protect layer 6 is formed so as to expose an n-type portion 4. As material of the protective layer 6, ZnS, CdTe, and the like may be used in consideration of the interface charge or the leak current. In addition, an electrode 7 is formed on the exposed n-type portion 3. The material of the electrode 7 may be In, Al, and the like.

Meanwhile, a bump 8 is formed on the region of the silicon substrate 5 having a signal processing portion which corresponds to a pixel. Material of the bump 8 may be In, a lead alloy such as a solder, and the like. Note that the material of the electrode 7 should preferably be the same as that of the bump 8, in view of connection. In addition, the signal processing portion means a carrier transfer portion, CCD (Charge Coupled Device), and the like.

The above silicon substrates 1 and 5 are connected with each other, for example, by connecting the electrode 7 with the bump 8 by a method of pressure welding.

Figure 2:
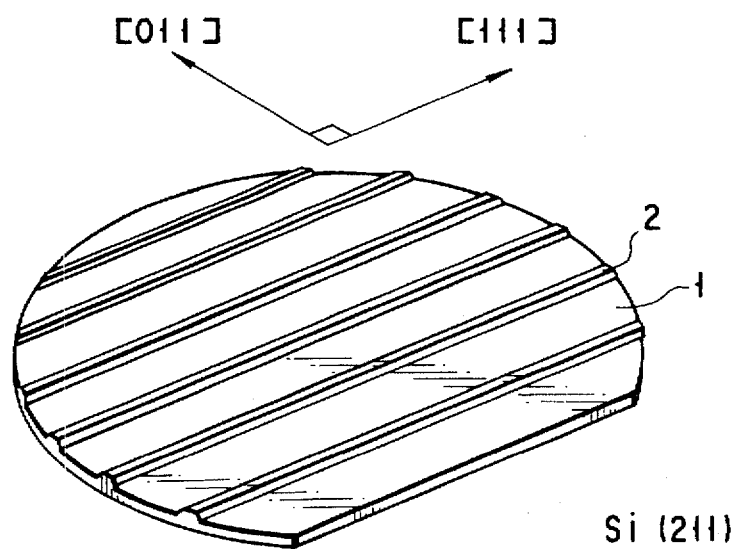
FIG. 2 is a perspective view showing an example of a silicon substrate used in a hybrid type infrared detector according to the present invention.
Figure 3:
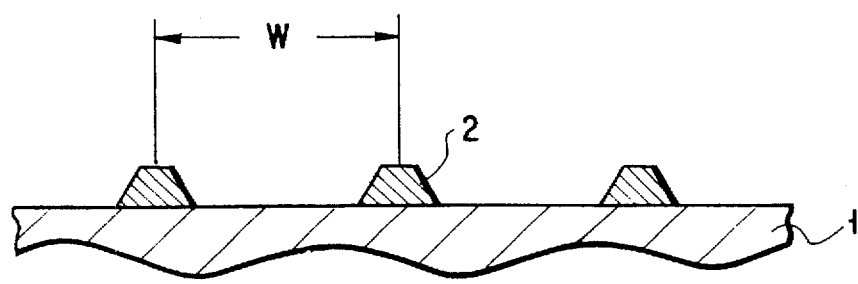
FIG. 3 is a cross-sectional view showing a silicon substrate shown in FIG. 2.

The following explanation will be made to a case in which the hybrid type infrared detector of the present invention is manufactured. At first, liner projecting portions 2 made of $SiO_2$, Si, SiN, and the like are formed, for example, on the surface (211) face of the silicon substrate 1 in the light detecting portion side, as shown in FIG. 2 and FIG. 3. This projecting portions 2 are formed along a cleavage plane (011) of HgCdTe formed on the (211) face of the silicon substrate (in the direction of [111]). The distance W between projecting portions 2 is set to about 40 µm which is the size of a pixel.

In the next, p-type $Hg_{0.77}Cd_{0.23}Te$ is subjected to epitaxial growth with a thickness of 10 µm in a vapor phase or a liquid phase, thereby to form a p-type HgCdTe layer 3 on the silicon substrate 1 on which projecting portions 2 are formed as shown in FIG. 4. This p-type HgCdTe layer 3 is once cooled to an ambient temperature. Here, the thermal expansion coefficient of silicon is $2.3 \times 10^{-6} K^{-1}$, and the thermal expansion coefficient of $Hg_{0.77}Cd_{0.23}Te$ is about $5 \times 10^{-6} K^{-1}$. If the silicon substrate 1 is cooled together with the p-type HgCdTe layer 3, a thermal stress is generated at the positions of the projecting portions 2, due to the difference in the thermal expansion coefficient. Clacks as partitioning portions are created in the p-type HgCdTe layer 3.

Figure 4A:
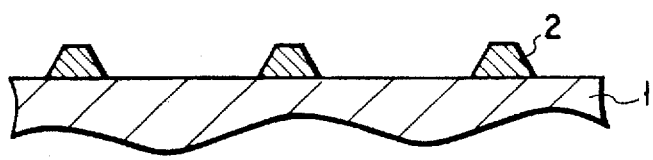
FIGS. 4A to 4D are cross-sectional views for explaining an example of a method of manufacturing a hybrid type infrared detector.
Figure 4B:
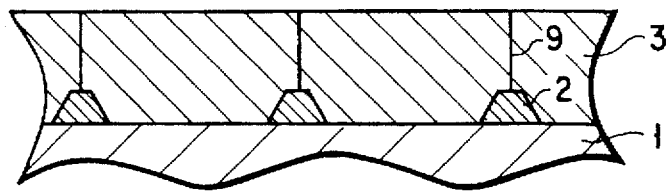
Figure 4C:
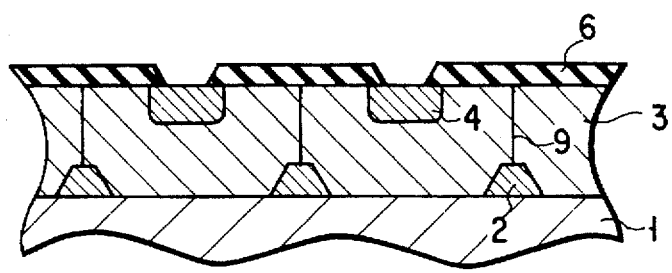

In the next, as shown in FIG. 4C, boron ions are implanted into the regions partitioned by the partitioning portions 9, i.e., the regions corresponding to pixels, thereby to form n-type HgCdTe layers 4. Further, a ZnS film is formed on the p-type HgCdTe layer 3, and patterning is performed by a photolithography technique such that the n-type HgCdTe layer 4 is exposed, thereby to form a protective layer 6.

Figure 4D:
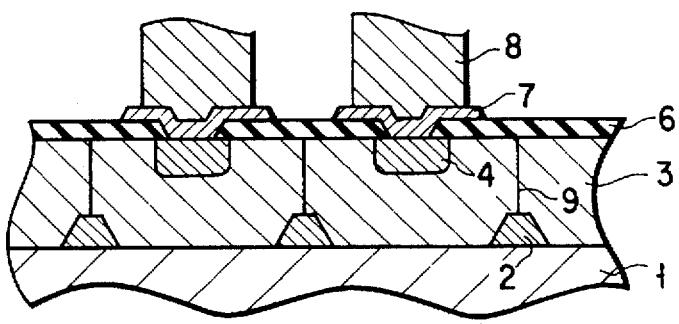

Subsequently, as shown in FIG. 4D, In is evaporated on the p-type HgCdTe layer 3 to form electrodes 7 by patterning. Meanwhile, In is deposited on the silicon substrate 5 in which a signal processing portion is formed, thereby to form bumps 8. The silicon substrates 1 and 5 are pressed against each other such that the electrodes 7 and bumps 8 are pressed into contact with each other. Thus, the hybrid type infrared detector of the present invention is completed.

Figure 5:
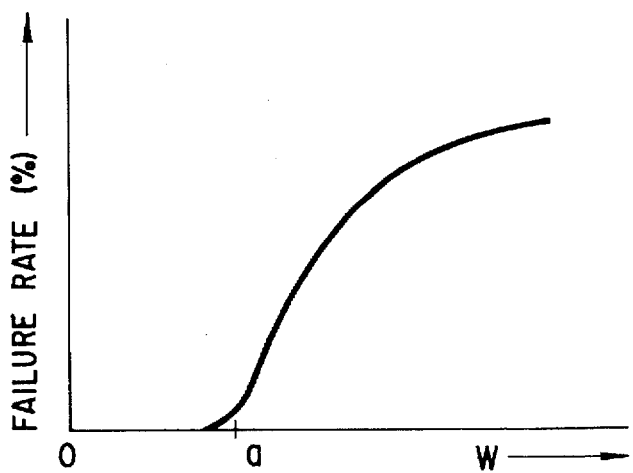
FIG. 5 is a characteristic graph showing the relationship between the interval of linear projections formed on the silicon substrate and the pixel failure rate.

In the infrared detector having the structure as described above, since a photodiode is constituted by a p-n junction between the p-type HgCdTe layer and the n-type HgCdTe portion, photo-carriers are generated at the junction portion when infrared light enters into the p-n junction portion of the photodiode. The carriers are diffused and injected into the signal processing portion through In bumps, and are outputted in form of an image. In this case, partitioning portions 9 are formed in the p-type HgCdTe layer 3, and a thermal stress caused by a difference between thermal expansion coefficients due to cooling is sufficiently relaxed. Peeling the In bump from the In electrode, or breakage of the In bump or the In electrode does not occur in each pixel. Therefore, no defective pixels are substantially caused, and it is therefore possible to realize an infrared detector having a high reliability. Actually, when used as an infrared camera, the rate of defective pixels to operating pixels was less than 1%. Note that the rate of defects caused by defective pixels decreases when the distance between the projecting portions 2 satisfies a relation of a >W where the pixel size is expressed as a, as shown in FIG. 5.

Meanwhile, when the infrared detector is manufactured without forming partitioning portions 9, peeling occurs between an In bump and an In electrode due to a thermal stress caused by a thermal expansion coefficient difference, thereby causing defective pixels. When actually used as an infrared camera, the rate of defective pixels to operating pixels was 10%.

As has been explained above, the hybrid type infrared detector according to the present invention comprises a plurality of photodiodes each constructed by a p-n junction made of a compound semiconductor material consisting of group II elements and group VI elements of the periodic table on a silicon substrate, a signal processing portion formed on another substrate, and a connecting member for electrically connecting a plurality of photodiodes with the signal processing portion and for injecting carriers generated by the photodiodes into the signal processing portion, wherein partitioning portions are formed along the cleavage plane of the compound semiconductor material. Therefore, the thermal stress between silicon and compound semiconductor material can be relaxed, and light detecting portions can be prevented from being deformed. In addition, connecting members which connecting the infrared detecting portions and the signal processing portion can be prevented from being broken or peeled. In addition, since the partitioning portions are formed, it is possible to separate pixels from each other and to reduce the cross-talk. As a result of this, it is possible to realize a hybrid type infrared detector which has high reliability and high sensitivity.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A hybrid type infrared detector comprising:
   a plurality of photodiodes comprised of p-n junctions made of compound semiconductor material on a silicon substrate;
   a signal processing portion formed on another substrate; and
   a connecting member for electrically connecting the plurality of photodiodes with the signal processing portion, and for injecting carriers generated by the photodiodes into the signal processing portion,
   wherein partitioning portions are formed along a cleavage plane of the compound semiconductor material, and
   wherein the cleavage plane is (n11).

2. A hybrid type infrared detector according to claim 1, wherein the cleavage plane of the compound semiconductor material is (011).

3. A hybrid type infrared detector according to claim 1, wherein a projecting portion is formed on the silicon substrate along a direction of the cleavage plane.

4. A hybrid type infrared detector according to claim 3, wherein the projecting portion is made of material selected from the group consisting of $SiO_2$, Si and SiN.

5. A hybrid type infrared detector according to claim 1, wherein the partitioning portion extends along a direction of the cleavage plane of the compound semiconductor material.

6. A hybrid type infrared detector according to claim 1, wherein the connecting member is made of material selected from the group consisting of Indium and a lead alloy.

7. A hybrid type infrared detector according to claim 1, wherein the compound semiconductor material is selected from the group consisting of compound semiconductor material consisting of group II elements and group VI elements of the periodic table, and compound semiconductor consisting of group IV elements and group VI elements.

8. A hybrid type infrared detector according to claim 7, wherein the compound semiconductor material is HgCdTe.

9. A hybrid type infrared detector according to claim 1, wherein the distance between the partitioning portions is smaller than a size of a pixel.

* * * * *